United States Patent
Park et al.

(10) Patent No.: US 8,247,266 B2
(45) Date of Patent: Aug. 21, 2012

(54) THIN FILM TRANSISTOR, METHOD OF MANUFACTURING THE SAME, AND FLAT PANEL DISPLAY DEVICE HAVING THE SAME

(75) Inventors: Jin-Seong Park, Suwon-si (KR); Kwang-Suk Kim, Suwon-si (KR); Jong-Han Jeong, Suwon-si (KR); Jae-Kyeong Jeong, Suwon-si (KR); Steve Y. G. Mo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 13/102,984

(22) Filed: May 6, 2011

(65) Prior Publication Data
US 2011/0212580 A1    Sep. 1, 2011

Related U.S. Application Data

(62) Division of application No. 12/320,775, filed on Feb. 4, 2009, now Pat. No. 8,008,658.

(30) Foreign Application Priority Data

Feb. 5, 2008 (KR) .................. 10-2008-0011492

(51) Int. Cl.
*H01L 21/00* (2006.01)
(52) U.S. Cl. ............... 438/104; 257/43; 257/E29.296
(58) Field of Classification Search ............ 257/43, 257/E29.296; 438/104
See application file for complete search history.

(56) References Cited

U.S. PATENT DOCUMENTS

| 7,101,813 B2 | 9/2006 | Ahn et al. |
| 2007/0108446 A1 | 5/2007 | Akimoto |
| 2008/0308826 A1 | 12/2008 | Lee et al. |

FOREIGN PATENT DOCUMENTS

| JP | 2006-098480 | 4/2006 |
| JP | 2007-201366 | 8/2007 |
| JP | 2007-250982 | 9/2007 |

OTHER PUBLICATIONS

Korean Office Action issued by Korean Intellectual Property Office on Nov. 23, 2009 in Applicant's corresponding Korean Patent Application No. 10-2008-0011492.
Korean Office Action issued by Korean Intellectual Property Office on May 25, 2010 in Applicant's corresponding Korean Patent Application No. 10-2008-0011492.

*Primary Examiner* — Minh-Loan T Tran
(74) *Attorney, Agent, or Firm* — Robert E. Bushnell, Esq.

(57) ABSTRACT

A thin film transistor (TFT) using an oxide semiconductor layer as an active layer, a method of manufacturing the TFT, and a flat panel display (FPD) including the TFT are taught. The TFT includes a gate electrode formed on a substrate, an oxide semiconductor layer electrically insulated from the gate electrode by a gate insulating layer, and the oxide semiconductor layer including a channel region, a source region, and a drain region, and a source electrode and a drain electrode respectively electrically contacting the source region and the drain region. The oxide semiconductor layer is formed of an InZnO or IZO layer (indium zinc oxide layer) including Zr. The carrier density of the IZO layer is controlled to be $1 \times 10^{13}$ to $1 \times 10^{18}$ #cm$^{-3}$ by controlling an amount of Zr.

6 Claims, 6 Drawing Sheets

THIN FILM TRANSISTOR, METHOD OF MANUFACTURING THE SAME, AND FLAT PANEL DISPLAY DEVICE HAVING THE SAME

CROSS-REFERENCE TO RELATED APPLICATIONS AND CLAIM OF PRIORITY

This application is a divisional application of the prior application Ser. No. 12/320,775 filed in the U.S. Patent & Trademark Office on 4 Feb. 2009 and assigned to the assignee of the present invention. Furthermore, this application makes reference to, incorporates the same herein, and claims all benefits accruing under 35 U.S.C. §119 from an application for THIN FILM TRANSISTOR, METHOD OF MANUFACTURING THE SAME, AND FLAT PANEL DISPLAY HAVING THE SAME earlier filed in the Korean Intellectual Property Office on 5 Feb. 2008 and there duly assigned Serial No. 10-2008-0011492.

BACKGROUND OF THE INVENTION

1. Field of the Invention

The present invention relates to a thin film transistor (TFT), a method of manufacturing the thin film transistor, and a flat panel display (FPD) device including the thin film transistor, and more particularly, to a TFT using oxide semiconductor as an active layer, a method of manufacturing the thin film transistor (TFT), and a FPD device including the thin film transistor (TFT).

2. Description of the Related Art

In general, a thin film transistor (TFT) includes an active layer which provides a channel region, a source region and a drain region, and a gate electrode electrically insulated from the active layer by an insulating layer with the gate electrode being formed on the channel region.

The active layer of the TFT having the above mentioned structure may be formed of a semiconductor material such as amorphous silicon or poly-silicon. When the active layer is formed of the amorphous silicon, the mobility of the TFT is relatively low so that it is difficult to realize a driving circuit that operates at a high speed. When the active layer is formed of the poly-silicon, even though the mobility of the TFT is relatively high, a threshold voltage may be disadvantageously non-uniform so that an additional compensating circuit is required.

In addition, in a contemporary method of manufacturing the TFT using low temperature poly-silicon (LTPS), because an expensive process such as a laser heat treatment may be included and may be difficult to control characteristics, it is difficult to apply the expensive method to fabricate TFT on a large area substrate.

Recently, in order to solve the above stated problems, research has been performed to employ an oxide semiconductor as the active layer.

In Japanese Patent Publication No. 2004-273614, a TFT using oxide semiconductor in which Zinc Oxide (ZnO) is a main component as an active layer is disclosed.

The oxide semiconductor in which the ZnO is the main component is evaluated as an amorphous and stable material. When the oxide semiconductor is employed to form the active layer, it is possible to manufacture the TFT by using the low temperature poly-silicon (LTPS) process at a low temperature not higher than 300° C.

In order to apply the oxide semiconductor in which the ZnO is the main component to during fabricating the TFT, however, it is necessary to develop a process to enhance an electric characteristic of the TFT and thus improving the electric characteristic of the TFT.

SUMMARY OF THE INVENTION

It is therefore one object of the present invention to provide a thin film transistor, a method of manufacturing the thin film transistor and a flat panel display having the thin film transistor in order to enhance an electric characteristic of the TFT.

It is another object of the present invention to provide a thin film transistor capable of easily controlling the carrier density of an oxide semiconductor layer, a method of manufacturing the thin film transistor, and a flat panel display (FPD) device including the thin film transistor.

In order to achieve the foregoing and other objects of the present invention, according to an aspect of the present invention, a thin film transistor (TFT) may be constructed with a substrate, a gate electrode formed on the substrate, an oxide semiconductor layer electrically insulated from the gate electrode by a gate insulating layer and including a channel region, a source region, and a drain region, and a source electrode and a drain electrode respectively electrically contacting the source region and the drain region. The oxide semiconductor layer may be formed of an IZO layer including Zr. IZO refers to InZnO which is indium zinc oxide.

According to another aspect of the present invention, a method of manufacturing a TFT contemplates forming a gate electrode on a substrate, forming a gate insulating layer including the gate electrode on the substrate, forming an oxide semiconductor layer that provides a channel region, a source region, and a drain region on the gate insulating layer, and forming a source electrode and a drain electrode that contact the source region and the drain region. In forming an oxide semiconductor layer that provides a channel region, a source region, and a drain region on the gate insulating layer, ions including In, Zn, and Zr are deposited from a target so that an IZO layer including Zr may be formed on the gate insulating layer.

According to still another aspect of the present invention, a flat panel display (FPD) device may be constructed with a first substrate where a plurality of pixels are defined by a plurality of first and second conductive lines and a TFT controls signals supplied to each of the plurality of pixels and a first electrode is coupled to the TFT, a second substrate where a second electrode is formed and the second substrate is spaced apart from the first substrate, and a liquid crystal layer injected into a sealed up space between the first electrode and the second electrode. The TFT includes a gate electrode formed on the first substrate, an oxide semiconductor layer electrically insulated from the gate electrode by a gate insulating layer, and the oxide semiconductor layer including a channel region, a source region, and a drain region, and a source electrode and a drain electrode respectively electrically contacting the source region and the drain region. The oxide semiconductor layer may be formed of an IZO layer including Zr.

According to still another aspect of the present invention, a FPD device may be constructed with a first substrate on which an organic light emitting diode (OLED) including a first electrode, an organic thin film layer, and a second electrode and a TFT for controlling the operation of the OLED is formed, and a second substrate provided to face the first substrate. The TFT includes a gate electrode formed on the first substrate, an oxide semiconductor layer eclectically insulated from the gate electrode by a gate insulating layer and including a channel region, a source region, and a drain region, and a source electrode and a drain electrode respectively electrically contacting the source region and the drain region. The oxide semiconductor layer may be formed of an IZO layer (indium zinc oxide layer) including Zr.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
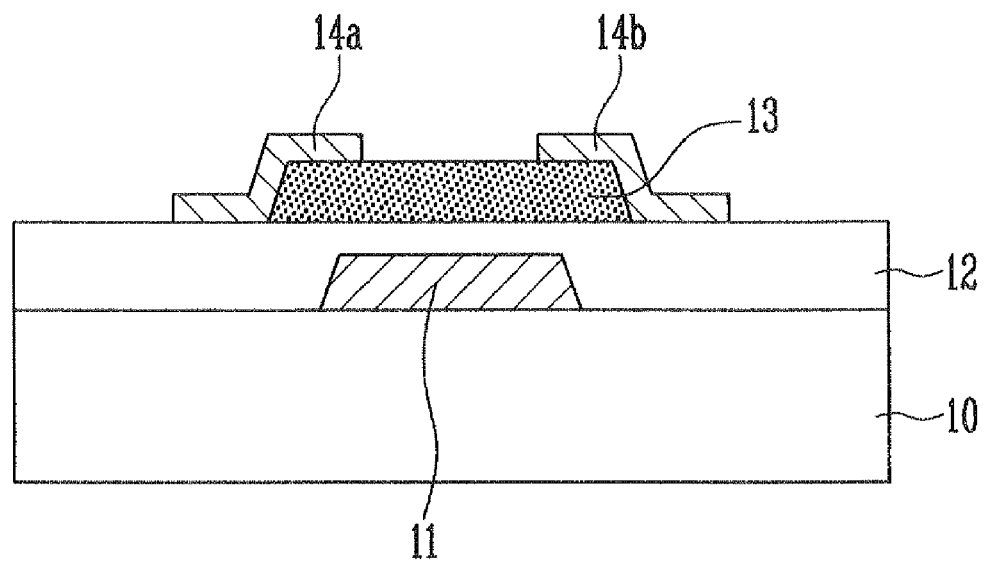
FIG. 1 is a cross-sectional view illustrating a thin film transistor (TFT) constructed as the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

FIG. 1 is a cross-sectional view illustrating a thin film transistor (TFT) constructed as the present invention.

A gate electrode 11 is formed on a substrate 10 formed of an insulating material. A buffer layer (not shown) can be formed between substrate 10 and gate electrode 11.

A gate insulating layer 12 to cover gate electrode 11 is formed on substrate 10. An oxide semiconductor layer 13 is electrically insulated from gate electrode 11 by gate insulating layer 12 and provides a channel region, a source region, and a drain region. Oxide semiconductor layer 13 is formed on gate insulating layer 12. Oxide semiconductor layer 13 is formed of an InZnO (IZO) layer including Zr so that the carrier density of the IZO layer (indium zinc oxide layer) is controlled to be $1\times10^{13}$ to $1\times10^{18} \#cm^{-1}$ (# is the number of carriers) by Zr.

A source electrode and a drain electrode 14a and 14b that contact the source region and the drain region are formed on oxide semiconductor layer 13.

Figure 2A:
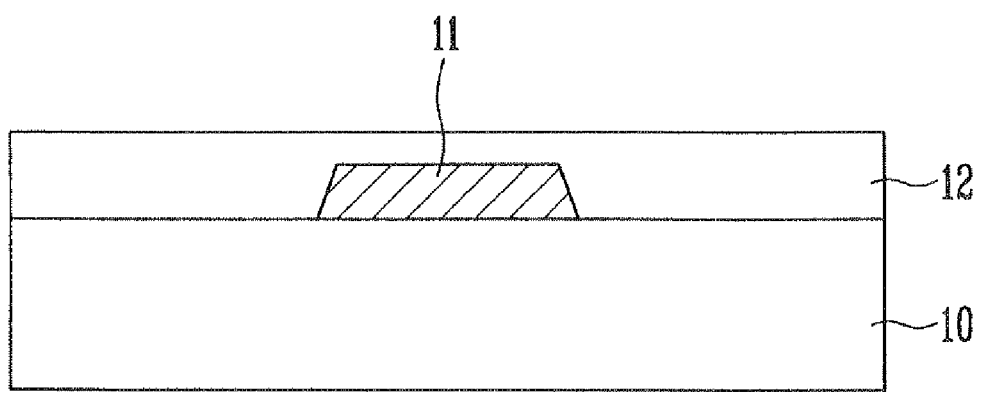
FIGS. 2A through 2C are cross-sectional views illustrating a method of manufacturing the TFT constructed as the present invention.
Figure 2B:
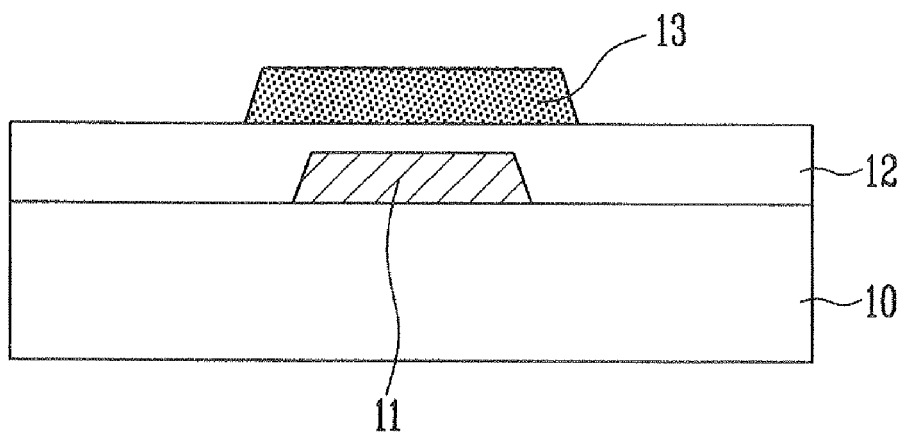
Figure 2C:
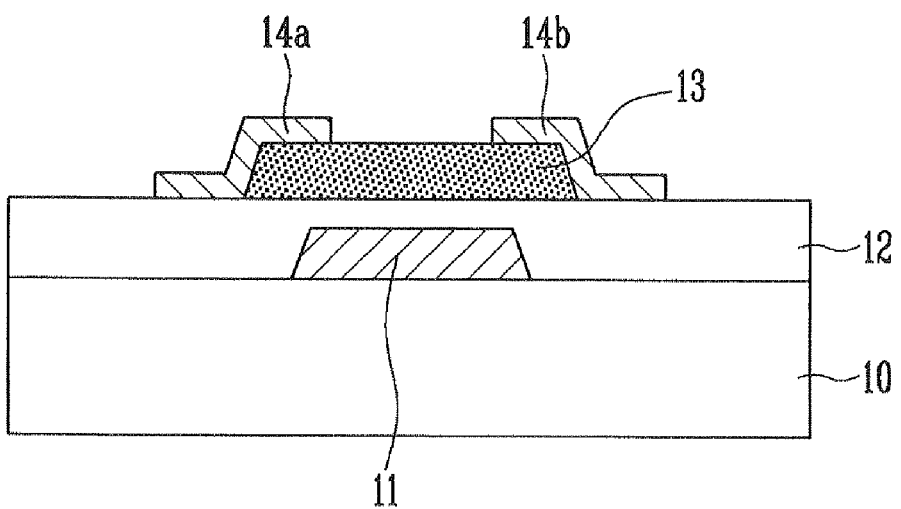

FIGS. 2A to 2C are cross-sectional views illustrating a method of manufacturing the TFT constructed as the present invention. The TFT according to the present invention will be described in detail through manufacturing processes.

Referring to FIG. 2A, after forming gate electrode 11 on substrate 10 formed of the insulating material, gate insulating layer 12 is formed on gate electrode 11. At this time, after forming a buffer layer (not shown) on substrate 10, gate electrode 11 may be formed on the buffer layer. Gate electrode 11 is formed of metal such as Mo, MoW, and Al and gate insulating layer 12 is formed of $SiO_2$ or SiNx.

Referring to FIG. 2B, oxide semiconductor layer 13 that provides the channel region, the source region, and the drain region to overlap gate electrode 11, is formed on gate insulating layer 12. Oxide semiconductor layer 13 is formed of the InZnO (IZO) layer including Zr so that the carrier density of the IZO layer is controlled to be $1\times10^{13}$ to $1\times10^{18} \#cm^{-3}$ ("#" refers to the number of carriers) by Zr. The InZnO (IZO) layer including Zr may be formed to be amorphous or crystalline such as nano crystal in accordance with a deposition method.

Ions including In, Zn, and Zr are deposited from a target so that an IZO layer including Zr may be formed on gate insulating layer 12 as an embodiment of forming the IZO layer including Zr. An InZnO target and a Zr target may be used as a target during the deposition process. The amount of Zr is controlled by bias power applied to the target or the intensity of pulse laser so that the carrier density of the IZO layer may be controlled.

For example, in a co-sputtering method, the magnitude of the bias power applied to the Zr target is controlled or the intensity of the pulse laser radiated onto the Zr target is controlled so that the amount of the doped Zr may be controlled. When the amount (ratio) of the doped Zr in the ratio (In:Zn:Zr) of a cation is controlled to be no less than 20 At %, it is assumed that the carrier density is no more than $1\times10^{13}$ $\#cm^{-3}$ in Hall measurement. Therefore, when the amount of doped Zr is linearly changed (decreasing) in a range of 20 to 0 At %, the carrier density may be increased to about $1\times10^{21}$ $\#cm^{-3}$. "At %" here refers to an atomic percent.

Referring to FIG. 2C, a conductive layer is formed on oxide semiconductor layer 13 and is patterned to form source electrode and drain electrode 14a and 14b that contact the source region and the drain region of oxide semiconductor layer 13.

In the oxide semiconductor such as the IZO, the amount of $O_2$ is controlled in a deposition process to control the carrier density so that the oxide semiconductor layer has a semiconductor characteristic. It is however difficult to reduce the high carrier density ($1\times10^{20}$ to $1\times10^{21}\#cm^{-3}$) of the IZO layer to the carrier density ($1\times10^{13}$ to $1\times10^{18}\#cm^{-3}$) by which the oxide semiconductor layer may have the semiconductor characteristic by the practical processes.

According to the present invention, Zr is doped to easily reduce the high carrier density ($1\times10^{20}$ to $1\times10^{21}\#cm^{-3}$) of the IZO layer to the carrier density ($1\times10^{13}$ to $1\times10^{18}$ $\#cm^{-3}$) by which the oxide semiconductor layer may have the semiconductor characteristic. That is, it is assumed that electric conductivity may be reduced since $ZrO_x$ (Zr oxide) is formed so that the depletion of $O_2$ is reduced when the IZO layer is doped with Zr. As described above, when the amount of Zr is controlled, it is possible to control the electric conductivity.

Figure 3:
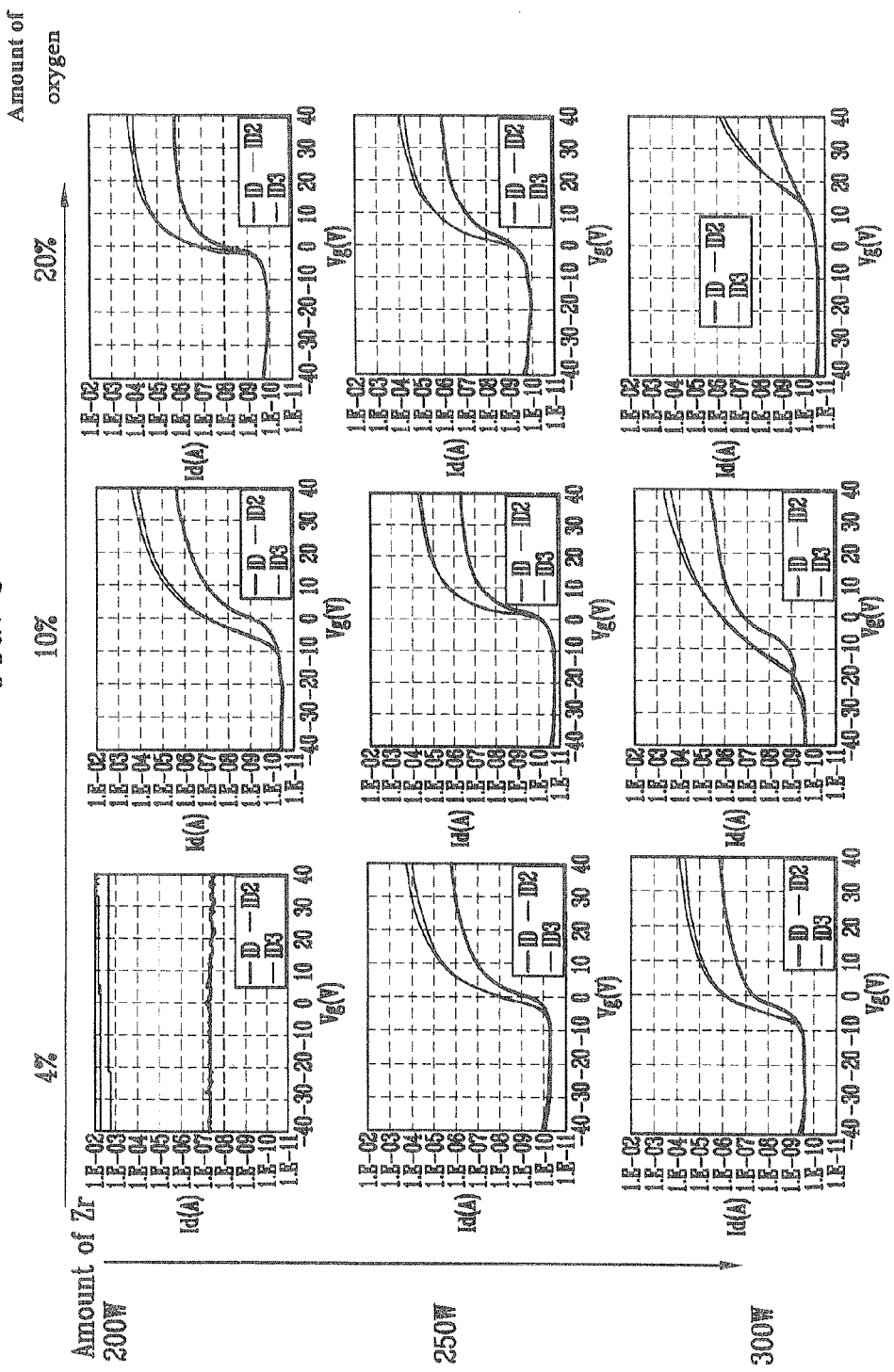
FIG. 3 is a graph illustrating the electric characteristic of the TFT according to the amounts of $O_2$ and Zr.

FIG. 3 is a graph illustrating the electric characteristic of the TFT according to the amounts of $O_2$ (i.e., oxygen, atomic weight of 16) and Zr (i.e., Zirconium, atomic weight of 91.22). The amount of Zr is represented by a bias power (unit W: watt) applied to a Zr target. Curves ID, ID2 and ID3 represent the on/off characteristics of the TFT where the voltage applied between drain and source are respectively 0.1V, 5.1 V and 10.1 V. The curves shown in FIG. 3 represent the on/off characteristics are changed in accordance with the amount of Zr, and the electric characteristic of the TFT is determined by the on/off characteristics. The on/off characteristics of the TFT, as shown in FIG. 3, are compared with each other through a change in drain current in accordance with a gate voltage. It is noted from the graph that the electric characteristic may be improved more when the amount of Zr is increased than when the amount of $O_2$ is increased. That is, the magnitude of bias power applied to the Zr target is controlled to increase the amount of Zr and to effectively reduce the carrier density so that oxide semiconductor layer 13 has the semiconductor characteristic.

As described above, since oxide semiconductor layer 13 constructed as the present invention is obtained by adding the transparent metal Zr to the transparent semiconductor material IZO, oxide semiconductor layer 13 is advantageous to manufacture of the transparent TFT and the TFT constructed as the present invention may be applied to a liquid crystal display (LCD) and organic light emitting display.

Figure 4:
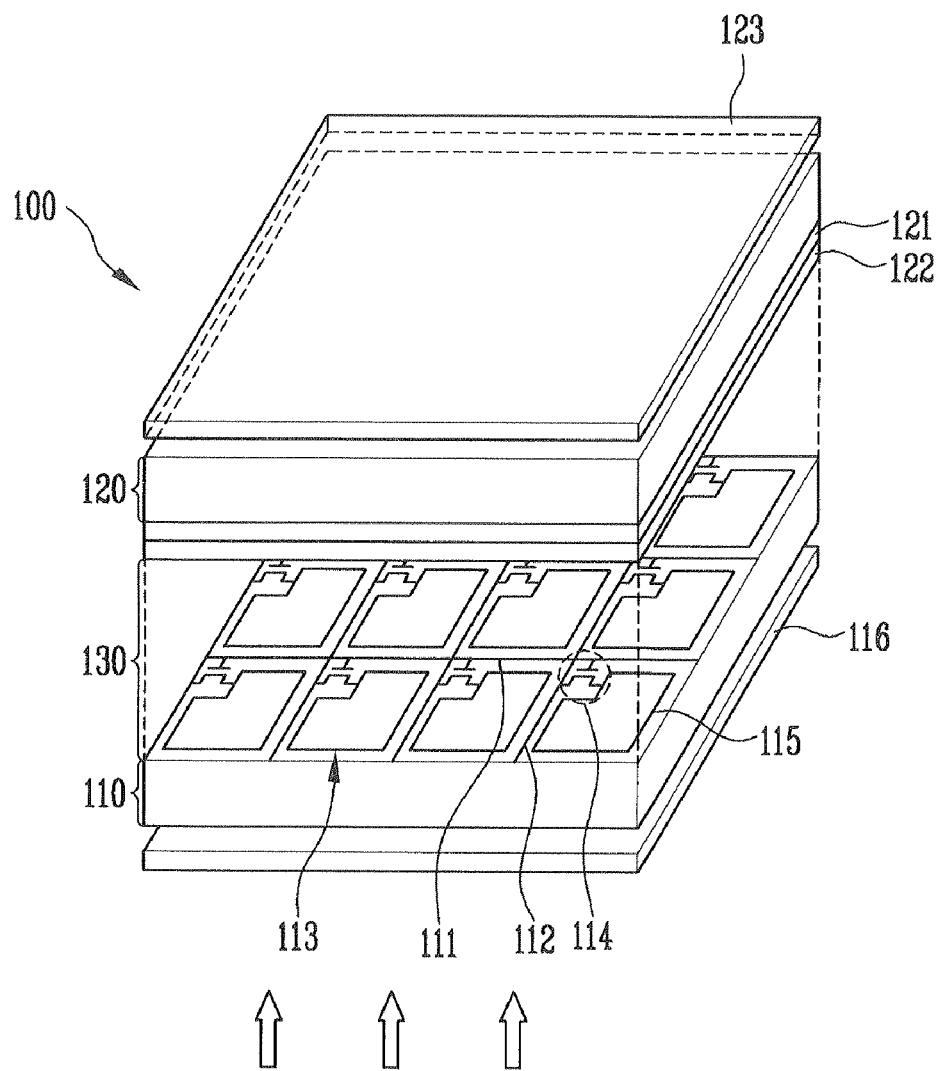
FIG. 4 is a perspective view illustrating a flat panel display (FPD) including the TFT constructed as an embodiment of the present invention.

FIG. 4 is a perspective view illustrating a flat panel display (FPD) including the TFT constructed as an embodiment of the present invention. The FPD will be schematically described based on a display panel 100 for displaying an image.

Display panel 100 includes two substrates 110 and 120 provided to face each other and a liquid crystal layer 130 interposed between two substrates 110 and 120. A pixel region 113 is defined by a plurality of gate lines 111 and data lines 112 arranged on a first substrate 110 in a matrix. TFTs 114 for controlling signals supplied to pixels and pixel electrodes 115 coupled to TFTs 114 are formed on first substrate 110 in the parts where gate lines 111 and data lines 112 intersect each other.

The TFT has the structure illustrated in FIG. 1 and may be manufactured by a manufacturing method according to the present invention described with reference to FIGS. 2A to 2C.

In addition, a color filter 121 and a common electrode 122 are formed on second substrate 120. Polarizing plates 116 and 123 are formed on the rear surfaces of two substrates 110 and 120 and a backlight (not shown) as a light source is provided under first polarizing plate 116.

On the other hand, a driver (integrated circuits for driving LCD; not shown) for driving display panel 100 is mounted around pixel region 113 of display panel 100. The driver converts electric signals provided from the exterior into scan signals and data signals to supply the scan signals and the data signals to the gate lines and the data lines.

Figure 5A:
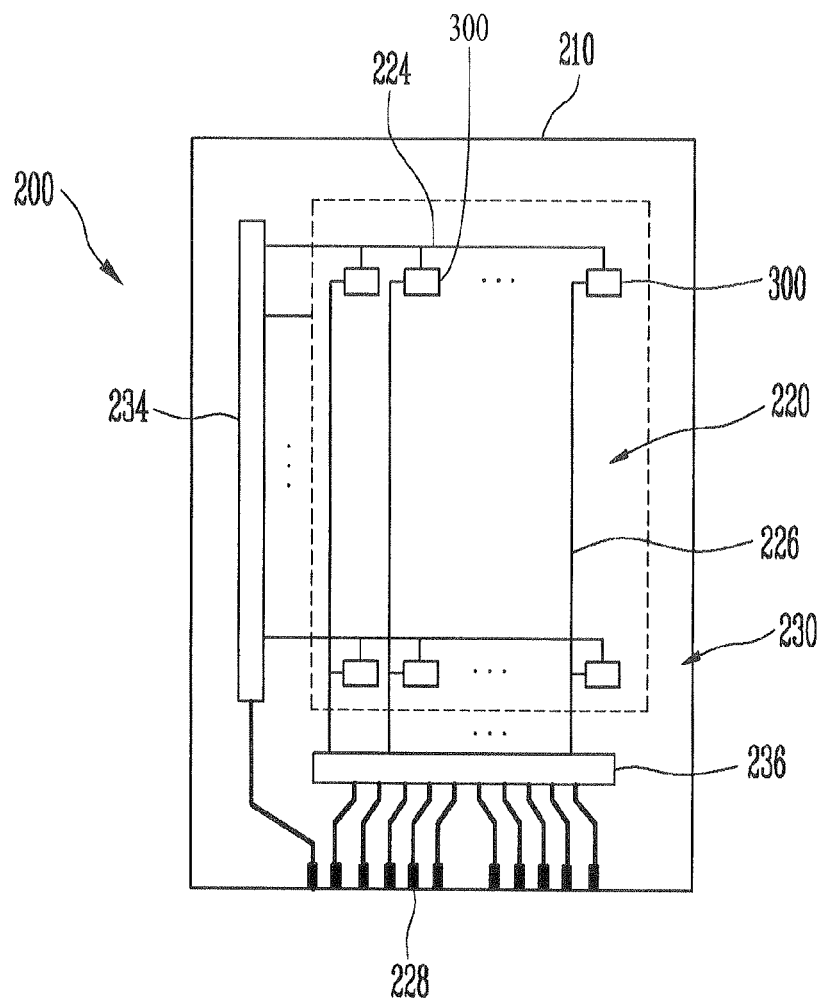
FIGS. 5A and 5B are respectively a plan view and a cross-sectional view illustrating the FPD including the TFT constructed as another embodiment of the present invention.
Figure 5B:
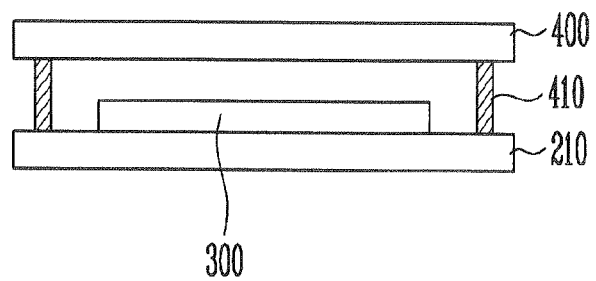

FIGS. 5A and 5B are respectively a plan view and a cross-sectional view illustrating the FPD including the TFT according to the present invention according to another embodiment of the present invention. The FPD will be schematically described based on a display panel 200 for displaying an image.

Referring to FIG. 5A, a substrate 210 includes a pixel region 220 and a non-pixel region 230 that surrounds pixel region 220. A plurality of organic light emitting diodes (OLED) 300 electrically coupled to each other in a matrix are formed between scan lines 224 and data lines 226 on substrate 210 of pixel region 220. Scan lines 224 and data lines 226 extended from scan lines 224 and data lines 226 of pixel region 220, power source supply lines (not shown) for operating OLEDs 300, and a scan driver 234 and a data driver 236 for processing the signals provided from the exterior through pads 228 to supply the processed signals to scan lines 224 and data lines 226 are formed on substrate 210 of non-pixel region 230.

Figure 6:
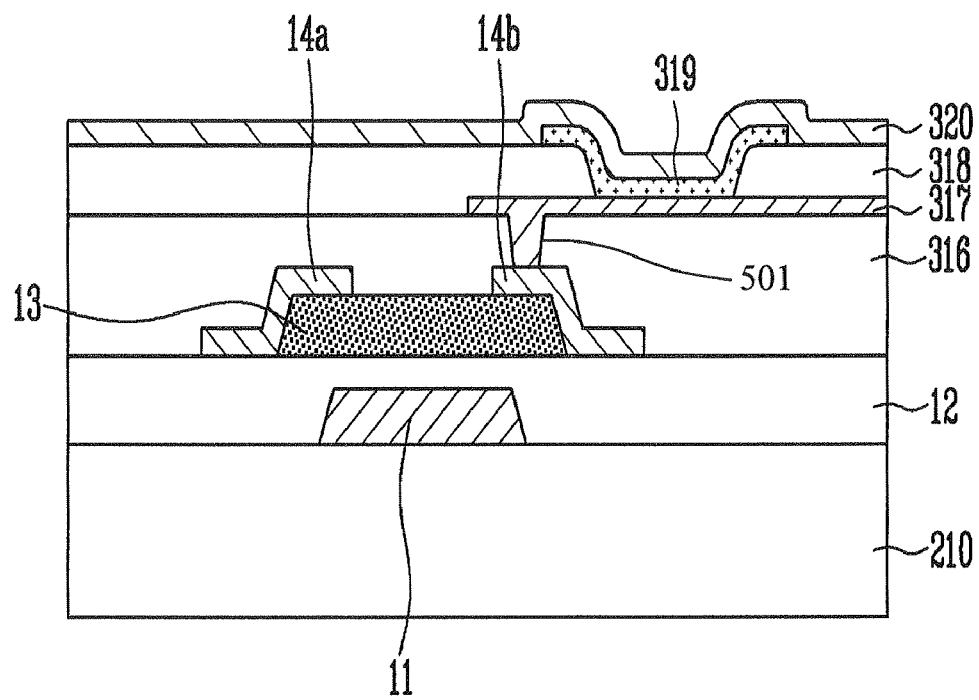
FIG. 6 is a cross-sectional view illustrating the organic light emitting diode (OLED) of FIG. 5A.

Referring to FIG. 6, OLED 300 includes an anode electrode 317, a cathode electrode 320, and an organic thin film layer 319 formed between anode electrode 317 and cathode electrode 320. Organic thin film layer 319 has a structure in which a hole transport layer, an organic light emitting layer, and an electron transport layer are laminated and a hole injecting layer and an electron injecting layer can be further included. In addition, a TFT for controlling the operation of OLED 300 and a capacitor for maintaining signals can be further included.

The TFT has the structure illustrated in FIG. 1 and can be manufactured by the manufacturing method according to the present invention described with reference to FIGS. 2A to 2C.

OLED 300 including the above-described TFT will be described in detail with reference to FIGS. 5A and 6.

Gate electrode 11 is formed on substrate 210. Here, scan lines 224 electrically coupled to gate electrode 11 are formed in pixel region 220 and scan lines 224 extended from scan lines 224 of pixel region 220 and pads 228 for receiving the signals from the exterior may be formed in non-pixel region 230.

Gate insulating layer 12 covering gate electrode 11 is formed on substrate 210. Oxide semiconductor layer 13 electrically insulated from gate electrode 11 by gate insulating layer 12 to provide the channel region, the source region, and the drain region is formed on gate insulating layer 12. Oxide semiconductor layer 13 is formed of the IZO layer including Zr and the carrier density of the IZO layer is controlled to be $1\times10^{13}$ to $1\times10^{18}$ #cm$^{-1}$ by Zr.

Source and drain electrodes 14a and 14b that contact the source and drain regions are formed on oxide semiconductor layer 13. At this time, data lines 226 coupled to source and drain electrodes 14a and 14b can be formed in pixel region 220 and data lines 226 extended from data lines 226 of pixel region 220 and pads 228 for receiving the signals from the exterior may be formed in non-pixel region 230.

A planarizing layer 316 to cover source and drain electrodes 14a and 14b is formed on gate insulating layer 12 and a via hole is formed in planarizing layer 316 so that source or drain electrode 14a or 14b is exposed.

Anode electrode 317 electrically coupled to source or drain electrode 14a or 14b through via hole 501 is formed and a pixel defining layer 318 is formed on planarizing layer 316 so that a portion (an emission region) of anode electrode 317 is exposed. Organic thin film layer 319 is formed on exposed anode electrode 317 and a cathode electrode 320 to cover organic thin film layer 319 is formed on pixel defining layer 318.

Referring to FIG. 5B, an encapsulating substrate 400 for sealing up pixel region 220 is provided on substrate 210 where OLED 300 is formed. Encapsulating substrate 400 and substrate 210 are attached to each other by a sealing material 410 to complete display panel 200.

In the TFT constructed as the present invention, the oxide semiconductor layer used as the active layer is formed of the IZO layer including Zr and the carrier density of the IZO layer is controlled to be $1\times10^{13}$ to $1\times10^{18}$ #cm$^{-3}$ by Zr. According to the present invention, Zr is doped to easily reduce the high carrier density of the IZO layer so that oxide semiconductor layer 13 may have the semiconductor characteristic. Therefore, manufacturing processes may be simplified and the electric characteristic of an element may be improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing a TFT, comprising:
forming a gate electrode on a substrate;
forming a gate insulating layer covering the gate electrode on the substrate;
forming an oxide semiconductor layer that provides a channel region, a source region, and a drain region on the gate insulating layer; and
forming a source electrode and a drain electrode that respectively contact the source region and the drain region,
wherein the step of forming an oxide semiconductor layer further comprising the steps of depositing ions including In, Zn, and Zr from a target to form an IZO (indium zinc oxide) layer comprising Zr on the gate insulating layer, and
controlling a carrier density of the IZO layer by controlling an amount of Zr.

2. The method as claimed in claim 1, in which the target comprises an InZnO target and a Zr target.

3. The method as claimed in claim 2, in which a magnitude of bias power applied to the Zr target is controlled to control an amount of Zr.

4. The method as claimed in claim 2, in which an intensity of pulse laser radiated on the Zr target is controlled to control an amount of Zr.

5. The method as claimed in claim 1, in which an amount of Zr is controlled so that a carrier density of the IZO layer is $1\times10^{13}$ to $1\times10^{18}$ $\#cm^{-3}$ by controlling the amount of Zr, where # refers to number of carriers.

6. The method as claimed in claim 1, in which an amount of Zr is controlled in a range of from 20 At % to 0 At % arranged in a decreasing order.

* * * * *